United States Patent [19]
Phillips

[11] Patent Number: 6,120,116
[45] Date of Patent: Sep. 19, 2000

[54] CIRCUIT BOARD STORAGE CABINET

[75] Inventor: Render W. Phillips, Canal Winchester, Ohio

[73] Assignee: Buckeye Stamping Company, Inc., Columbus, Ohio

[21] Appl. No.: 09/131,427

[22] Filed: Aug. 10, 1998

[51] Int. Cl.[7] ................................................. A47B 97/00
[52] U.S. Cl. ..................... 312/223.2; 312/111; 211/41.17
[58] Field of Search .............................. 312/223.1, 223.2, 312/257.1, 111, 263, 140, 265.5, 108, 265.2; 206/706, 707, 708; 211/41.17, 26; 361/756, 752, 796, 801, 802

[56] References Cited

U.S. PATENT DOCUMENTS

| | | |
|---|---|---|
| 2,364,083 | 12/1944 | Lindsay . |
| 3,044,658 | 7/1962 | Combs et al. . |
| 3,380,768 | 4/1968 | Wolfensberger ..................... 312/140 X |
| 4,123,129 | 10/1978 | Butler . |
| 4,236,774 | 12/1980 | Diaz . |
| 4,261,465 | 4/1981 | Thomas ................................... 206/708 |
| 4,277,120 | 7/1981 | Drake et al. . |
| 4,470,647 | 9/1984 | Bishoff et al. .......................... 312/111 |
| 4,884,715 | 12/1989 | Pohlmann . |
| 5,353,198 | 10/1994 | Kabat et al. ..................... 211/41.17 X |
| 5,466,058 | 11/1995 | Chan ....................................... 312/111 |
| 5,477,594 | 12/1995 | LePage ................................ 312/111 X |
| 5,564,802 | 10/1996 | Chiou . |
| 5,735,407 | 4/1998 | Kallio ..................................... 206/707 |
| 5,897,180 | 4/1999 | Singer ............................... 312/223.2 X |

FOREIGN PATENT DOCUMENTS

| | | | |
|---|---|---|---|
| 2374819 | 7/1978 | France ..................................... 361/796 |
| 2714562 | 10/1978 | Germany ................................ 361/796 |

Primary Examiner—Peter M. Cuomo
Assistant Examiner—James O. Hansen
Attorney, Agent, or Firm—Klemblas, Foster, Millard & Pollick

[57] ABSTRACT

A circuit board storage cabinet assembly provided having first and second panel members, a plurality of elongate frame members connected to the panel members, and a plurality of side panels. Each of the frame members has a first pair of grooves disposed perpendicularly to each other and a second pair of grooves disposed perpendicularly to each other. The second pair of grooves of adjacent frame members cooperate to hold a circuit board. Each of the side panels has two edges, with each elongate frame member first pair of grooves having disposed therein adjacent side panels. Each side panel has two side edges, a central planar portion having a planar outer surface and a planar inner surface, a panel insert portion directly adjacent each of the side edges, and a pair of intermediate panel portions, with each of the intermediate panel portions extending between the central planar portion and one of the panel insert portions. Each of both the first and second pair of grooves is formed having opposing planar, parallel surfaces connected to each other by a planar surface perpendicular to each of the opposing planar, parallel surfaces of the first and second pair of grooves, respectively.

14 Claims, 5 Drawing Sheets

CIRCUIT BOARD STORAGE CABINET

FIELD OF THE INVENTION

This invention relates to an electrical cabinet, particularly one for holding at least one circuit board, and more particularly to a circuit board storage cabinet whose dimensions can easily be changed in order to accommodate demands for cabinets of various sizes.

BACKGROUND OF THE INVENTION

This invention is directed to the providing of an electrical cabinet, and specifically to such a cabinet which can hold at least one circuit board. The existence of such cabinets is not new. Devices for operatively accommodating printed circuit boards or cards wherein connectors into which the boards are plugged are provided on the device for completing electrical connections with electronic components on the boards are well known.

With respect to many such prior art devices, they were often configured in the form of open racks or cages which included relatively complex receiving guides for guiding a plurality of circuit boards into engagement with their corresponding electrical connectors and for positively retaining the boards against inadvertent dislodgement without gripping the same too tightly or in a manner susceptible of causing damage to the board or to its electrical circuits or components. These devices suffered from a number of drawbacks.

One of the major drawbacks involving prior art cabinets for circuit boards was that the cabinets were often manufactured in predetermined sizes into which the circuits boards were forced to fit. Sometimes additional material was wedged between the circuit board and the cabinet itself in order to improve the fit, or an adapter of some type had to be supplied. Alternatively, the dimensions of the circuit board itself could be altered prior to installation into the cabinet. Due to these problems, some businesses insist on custom extrusions of the circuit board cabinet, or require the fabrication of an adapter.

Examples of some of the attempts to address the problem include U.S. Pat. No. 4,123,129 to Butler, U.S. Pat. No. 4,277,120 to Drake et al, U.S. Pat. No. 4,884,715 to Pohlmann, and U.S. Pat. No. 5,564,802 to Chiou.

However, it is apparent that the need exists for an improved cabinet for holding circuit boards, and specifically such a cabinet as can be easily fabricated for use in modular applications involving various sizes of circuit boards.

SUMMARY OF THE INVENTION

In accordance with this invention a circuit board storage cabinet assembly is formed having first and second panel members, a plurality of elongate frame members connected to the panel members, and a plurality of side panels. Each of the frame members has a first pair of grooves disposed perpendicularly to each other and a second pair of grooves disposed perpendicularly to each other. Each of the side panels has two edges, with each elongate frame member first pair of grooves having disposed therein adjacent side panels.

In the preferred embodiment of the circuit board storage cabinet of this invention, each panel member is directly adjacent an elongate frame member. Similarly, each side panel is directly adjacent a panel member. In the preferred embodiment of the invention, each side panel has two side edges, a central planar portion having a planar outer surface and a planar inner surface, a panel insert portion directly adjacent each of the side edges, and a pair of intermediate panel portions, with each of the intermediate panel portions extending between the central planar portion and one of the panel insert portions.

In the preferred embodiment of the invention, each of the first pair of grooves is of a first length, and each of the second pair of grooves is of a second length, with the first length being greater than the second length. Moreover, the second pair of grooves of adjacent frame members cooperate to hold a circuit board.

Preferably, each of the first pair of grooves is formed having opposing planar, parallel surfaces connected to each other by a planar surface perpendicular to each of the opposing planar, parallel surfaces of the first pair of grooves. Additionally, each of the second pair of grooves is formed having opposing planar, parallel surfaces connected to each other by a planar surface perpendicular to each of the opposing planar, parallel surfaces of the second pair of grooves.

There is also disclosed a circuit board storage cabinet assembly having first and second panel members, a plurality of elongate frame members connected to the panel members, with each of the frame members having a first pair of grooves disposed perpendicularly to each other and a second pair of grooves disposed perpendicularly to each other, such that the second pair of grooves of adjacent frame members cooperates to hold a circuit board, and with the circuit board storage cabinet assembly having a plurality of side panels, each of the side panels having two edges, a central planar portion having a planar outer surface and a planar inner surface, a panel insert portion directly adjacent each of the side edges, and a pair of intermediate panel portions, each of the intermediate panel portions extending between the central planar portion and one of the panel insert portions, and with each panel member being directly adjacent an elongate frame member, and with each elongate frame member first pair of grooves having disposed therein adjacent side panels.

In this invention, each panel member is directly adjacent an elongate frame member, and each side panel is directly adjacent a panel member. Preferably, each of the first pair of grooves is of a first length, and each of said second pair of grooves is of a second length, with the first length being greater than the second length.

In this invention, each of the first pair of grooves is formed having opposing planar, parallel surfaces connected to each other by a planar surface perpendicular to each of the opposing planar, parallel surfaces of the first pair of grooves. In addition, each of the second pair of grooves is formed having opposing planar, parallel surfaces connected to each other by a planar surface perpendicular to each of the opposing planar, parallel surfaces of the second pair of grooves.

There is also disclosed a circuit board storage cabinet assembly having first and second panel members, a plurality of elongate frame members connected to the panel members, with each panel member directly adjacent an elongate frame member, with each of the frame members having a first pair of grooves disposed perpendicularly to each other and a second pair of grooves disposed perpendicularly to each other, each of the first pair of grooves being of a first length, and each of the second pair of grooves being of a second length, with the first length being greater than the second length, each of the first pair of grooves formed having opposing planar, parallel surfaces connected to each other by a planar surface perpendicular to each of the opposing planar, parallel surfaces of the first pair of grooves, each of the second pair of grooves formed having opposing planar, parallel surfaces connected to each other by a planar surface perpendicular to each of the opposing planar, parallel surfaces of the second pair of grooves, such that the second pair of grooves of adjacent frame members cooperate to hold a circuit board, and with the circuit board storage cabinet assembly having a plurality of side panels, with each side panel being directly adjacent a panel member, and with each of the side panels having two edges, a central planar portion having a planar outer surface and a planar inner surface, a panel insert portion directly adjacent each of the side edges, and a pair of intermediate panel portions, with each of the intermediate panel portions extending between the central planar portion and one of the panel insert portions, with each panel member being directly adjacent an elongate frame member, and with each elongate frame member first pair of grooves having disposed therein adjacent side panels.

The primary objective of this invention is to provide a cabinet for holding circuit boards, which cabinet can have its dimensions modified in order to accommodate various sized circuit boards, but which cabinet can then easily be fabricated. Important aspects of this objective are to use components that can be extruded, and to use components configured such that they can be used more than once in the cabinet to be fabricated.

Other objects and advantages of the invention will be apparent from the following description, the accompanying drawings, and the appended claims.

DETAILED DESCRIPTION OF THE DRAWINGS

Figure 1:
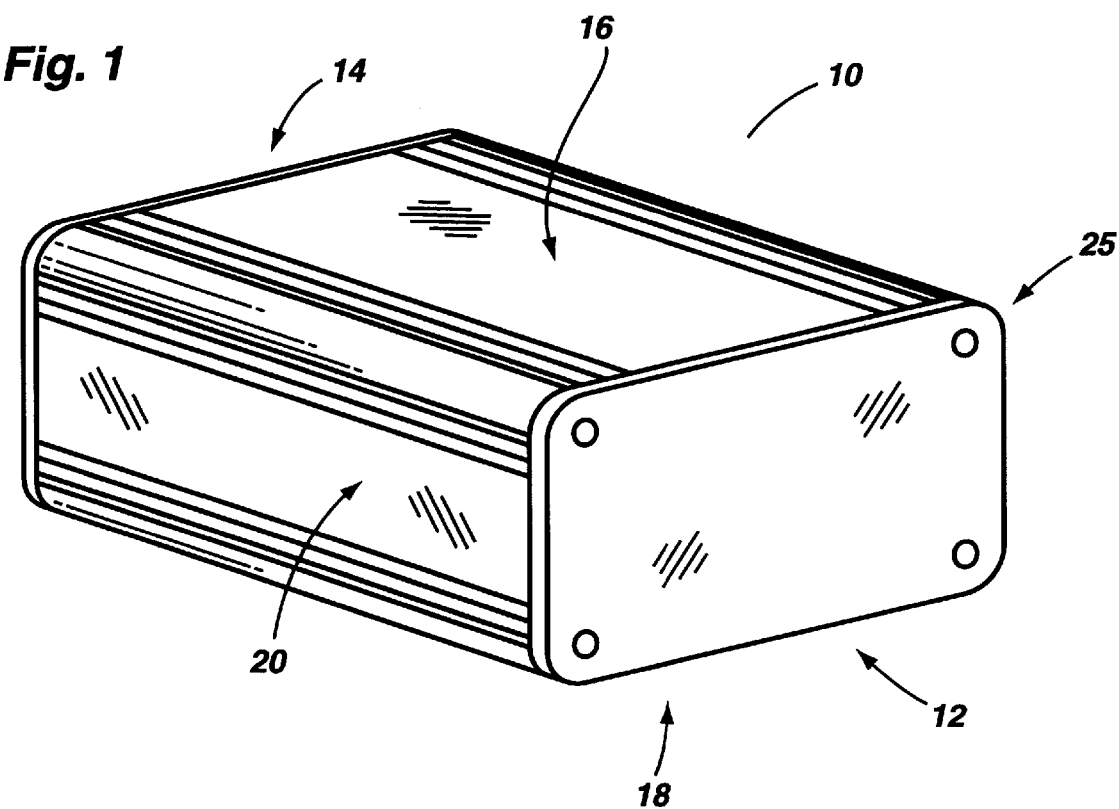
FIG. 1 is a perspective view of a cabinet made in accordance with the present invention.

Having reference to the drawings, attention is directed first to FIG. 1 which discloses a perspective view of a circuit board storage cabinet made in accordance with the present invention, with the cabinet assembly being designated generally by the numeral 10. Most of the general components of the cabinet assembly 10 are shown in, or can be appreciated from, FIG. 1. These include two panel members, a front panel 12 and a rear panel 14. The cabinet assembly also includes four side panels, a top panel 16, a bottom panel 18, a first side panel 20, and a second side panel 22.

Figure 2:
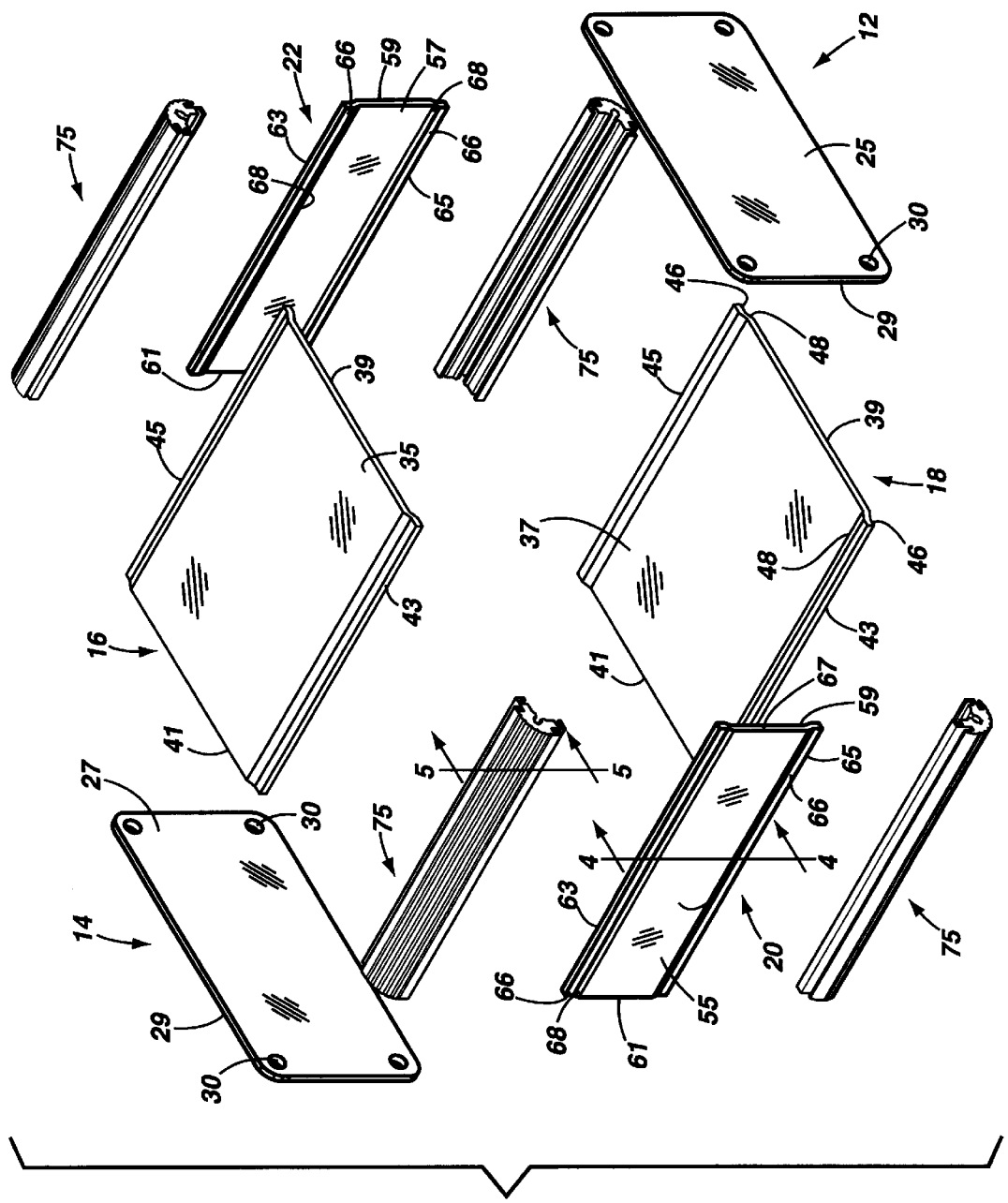
FIG. 2 is an exploded perspective view of the present invention, showing all of its various components.
Figure 3:
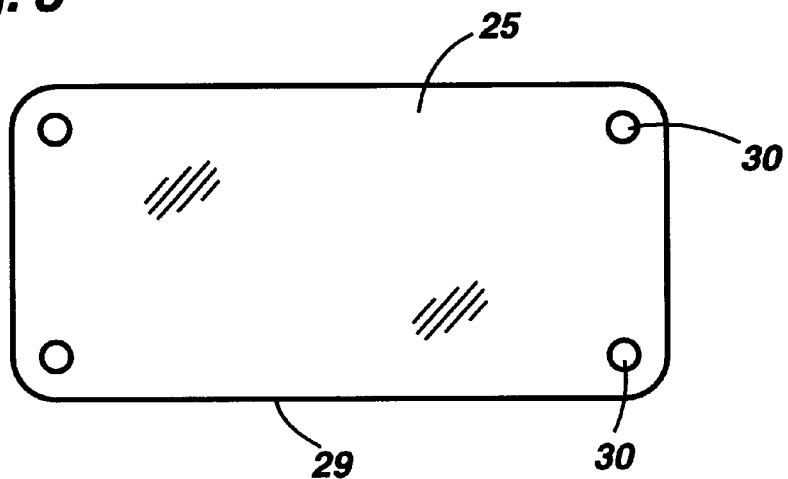
FIG. 3 is a side elevational view taken from the right side of FIG. 1, showing one of the two panel members of the present invention.

The specifics of the panel members 12 and 14 can be appreciated from a comparison of FIGS. 2 and 3. Each panel member has an outer surface 25 and an inner surface 27, both of which surfaces are preferably planar. A peripheral edge 29 extends around each panel member. A plurality of apertures 30 extending through each panel member preferably correspond to the number of frame members included in the cabinet assembly. The exterior of each panel member is preferably countersunk at each aperture so that the heads of the fastening members 32 which secure the panel members to the frame members are flush with the exterior of the respective panel member. The fasteners 32 preferably are tapped or thread-forming screws.

In the preferred embodiment of the invention each panel member is formed from 0.090 aluminum sheet. The corners of each panel member are rounded to simulate the curvature of the frame members which will be discussed below. The holes 30 drilled through the panel members, for example, four are shown in FIG. 3, are drilled 0.258" in from both the top and side of the panel member. Prior to this invention, in order to manufacture similar cabinets required fixed or dedicated tooling. This invention permits the assembly of cabinets using fabricating machinery, such as a turret press or shearer. For example, the first and second panels can be sheared, and the side panels can be sheared then offset.

Figure 4:
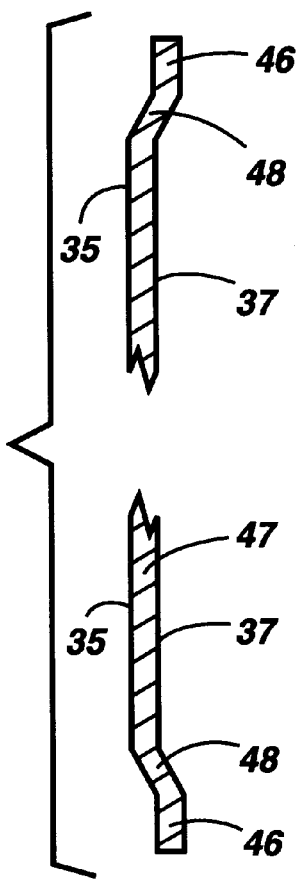
FIG. 4 is a vertical sectional view on an enlarge scale taken along line 4—4 of FIG. 2, showing a side panel used in the present invention.

The specifics of the side panels 16, 18, 20, and 22 can be appreciated from a comparison of FIGS. 2 and 4, even though FIG. 4 depicts only one of the four side panels. Each top panel 16 and bottom panel 18 has an outer surface 35 and an inner surface 37. Furthermore, each top panel and bottom panel has a front edge 39 and a rear edge 41, in addition to side edges 43 and 45. Preferably the front and rear edges are parallel to each other, as are the side edges. Of course it is to be understood that manufacturing tolerances may cause the edges to not be truly parallel, however for all practical purposes they will appear to be parallel.

Immediately adjacent each of the side edges of the side panels is an insert panel portion 46. In the preferred embodiment of the invention, each insert panel portion 46 is formed so as to be in a plane parallel to the central planar portion 47 of the respective side panel, and the planar inner surface and planar outer surface of the central planar portion. Between each insert panel portion 46 and central planar portion 47 is an intermediate panel portion 48. Preferably each intermediate panel portion 48 is planar. Thus, it will be appreciated that in the preferred embodiment of the invention, the top panel and bottom panel have identical dimensions.

Similarly, each first side panel 20 and second side panel 22 has an outer surface 55 and an inner surface 57. Furthermore, each of these two side panels has a front edge 59 and a rear edge 61, in addition to side edges 63 and 65. Preferably the front and rear edges are parallel to each other, as are the side edges.

Immediately adjacent each of the side edges of these two side panels is an insert panel portion 66. In the preferred embodiment of the invention, each insert panel portion 66 is formed so as to be in a plane parallel to the central planar portion 67 of the respective side panel, and the planar inner surface and planar outer surface of the central planar portion. Between each insert panel portion 66 and central planar portion 67 is an intermediate panel portion 68. Preferably each intermediate panel portion 68 is planar. Thus, it will be appreciated that in the preferred embodiment of the invention, the first side panel and the second side panel have identical dimensions.

With respect to the dimensions associated with the side panels, the thickness at the side edges is 0.062", while the effective thickness of the panel considered as a whole is 0.110". The term "effective thickness" refers to the distance between the inner surface of the insert panel portion and the outer surface of the central planar portion. Similarly, the width of each insert panel portion is 0.1201", while the central planar portions are spaced 0.250" from the nearest edge.

Figure 5:
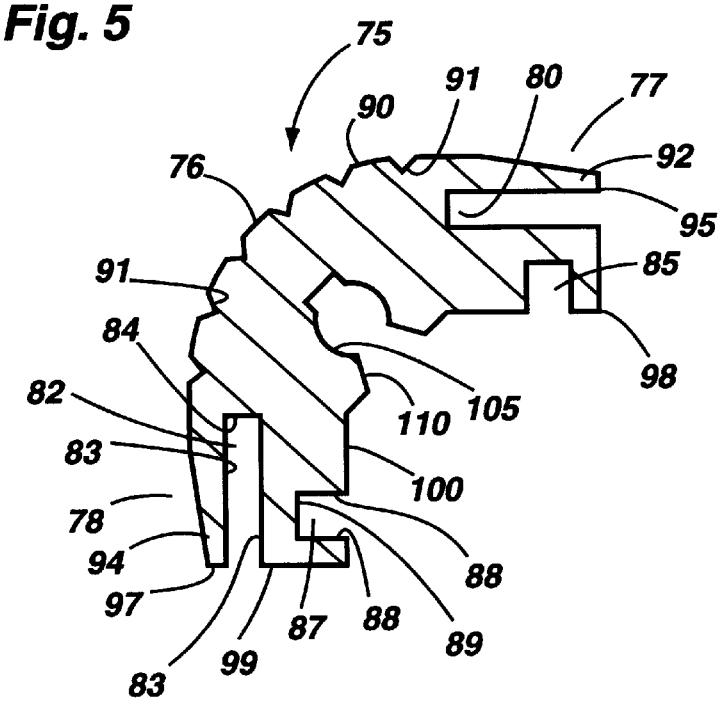
FIG. 5 is a vertical sectional view on a greatly enlarged scale taken along line 5—5 of FIG. 2, showing a frame member used in the present invention.

As mentioned briefly above, and as can be appreciated from a comparison of FIGS. 2 and 5, another essential component of the cabinet assembly of this invention are frame members 75. Each elongate frame member 75 has a central portion 76 and two end portions 77 and 78. End portion 77 has formed therein a first groove 80, while end portion 78 has formed therein a second groove 82. First groove 80 and second groove 82 comprise a first pair of grooves, with these grooves being perpendicular to each other. Each of the first pair of grooves 80 and 82 is formed having opposing planar, parallel surfaces 83 connected to each other by a planar surface 84 perpendicular to each of said opposing planar, parallel surfaces 83 of said first pair of grooves.

Similarly, end portion 77 has formed therein a third groove 85, while end portion 78 has formed therein a fourth groove 87. Third groove 85 and fourth groove 87 comprise a second pair of grooves, with these grooves also being perpendicular to each other. Each of the second pair of grooves 85 and 87 is formed having opposing planar, parallel surfaces 88 connected to each other by a planar surface 89 perpendicular to each of said opposing planar, parallel surfaces 88 of said second pair of grooves. Furthermore, each of the first pair of grooves 80 and 82 is of a first length, and each of the second pair of grooves 85 and 87 is of a second length, with the first length being greater than the second length. As can be appreciated from a comparison of the drawings, each one of the first pair of grooves is perpendicular to the one of the second pair of grooves which is directly adjacent to it.

Each elongate frame member 75 has a curved exterior surface portion 90 featuring a plurality of grooves 91. Tapered portions 92 and 94 at opposite ends of the frame member terminate at end wall first portions 95 and 97 respectively, with the end wall first portions extending from the exterior surface portion to the first pair of grooves. The tapering is done primarily for aesthetic reasons. End wall second portions 98 and 99 extend from the first pair of grooves to the interior surface portion 100 of the frame member. Preferably the end wall first portion and the end wall second portion are in the same plane.

It can be appreciated that each of the second pair of grooves is spaced a predetermined distance from a respective end wall second portion. Spaced equidistant from both end wall second portions is a groove 105, with a channel 110 connecting the groove to the interior surface portion 100. The faces of the channel are preferably spaced from each other at an angle of at least 60°.

In the preferred embodiment of the invention, each of the first pair of grooves is 0.068" wide and 0.250" long. Each of the second pair of grooves is 0.078" wide and 0.080" long, with each of them being spaced 0.050" from the end wall second portion. Each of the first pair of grooves is centered 0.166" from the interior surface portion 100. Each tapered portion extends 0.175", and each end wall first portion is 0.0251" in length. Preferably the six grooves are spaced equidistant from each other, with the outermost grooves being spaced 0.312" from the closest end wall first portion. The radius associated with the curvature of the frame member is 0.343", such that each groove is spaced 18° from each other. The groove 105, also known as a screwer boss, is extruded so as to permit the insertion of a 6-32 screw, which can be of the type known as a tapped or thread-forming screw.

When the cabinet assembly of this invention is assembled in its preferred embodiment, each elongate frame member first pair of grooves has disposed therein adjacent side panels. Further, each panel member is directly adjacent an elongate frame member. Still further, each side panel is directly adjacent a panel member.

Figure 6:
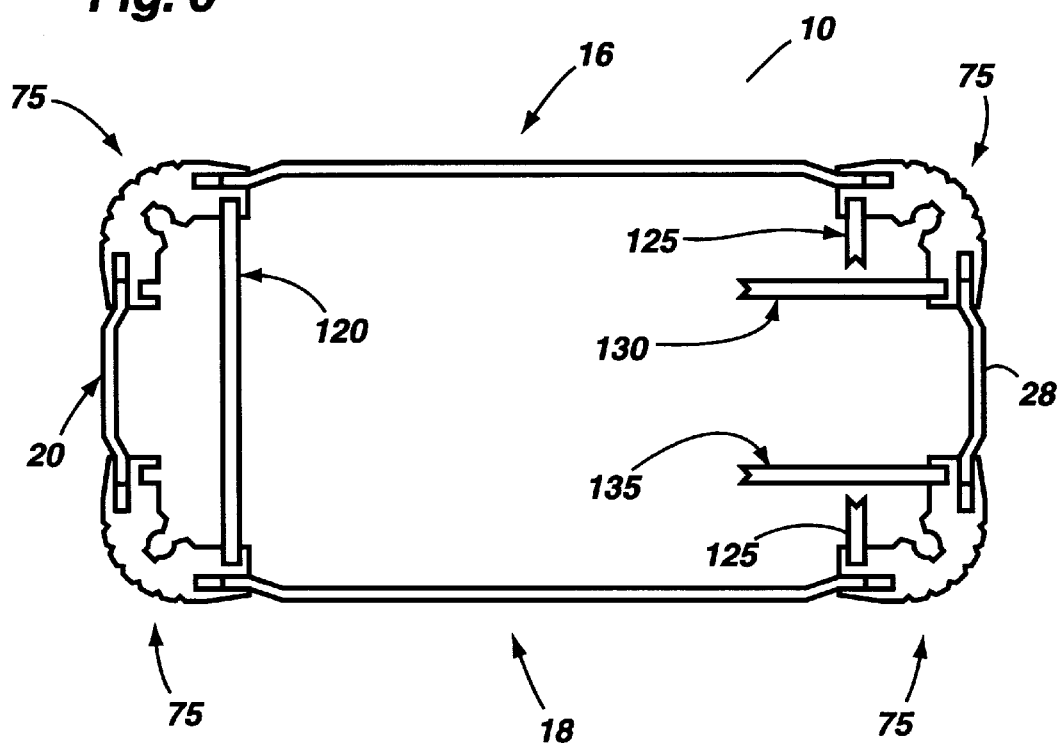
FIG. 6 is a side elevational view taken from the right side of FIG. 1, but with the panel member removed so as to reveal the interior of the present invention.

As assembled, each second pair of grooves of adjacent frame members can cooperate to hold a circuit board. For example, as shown in FIG. 6, circuit board 120 and/or 125 may be held, or circuit board 130 and/or 135 may be held. If more than two boards need holding, or if their placement must be other than as shown in FIG. 6, three alternatives exist.

Figure 7:
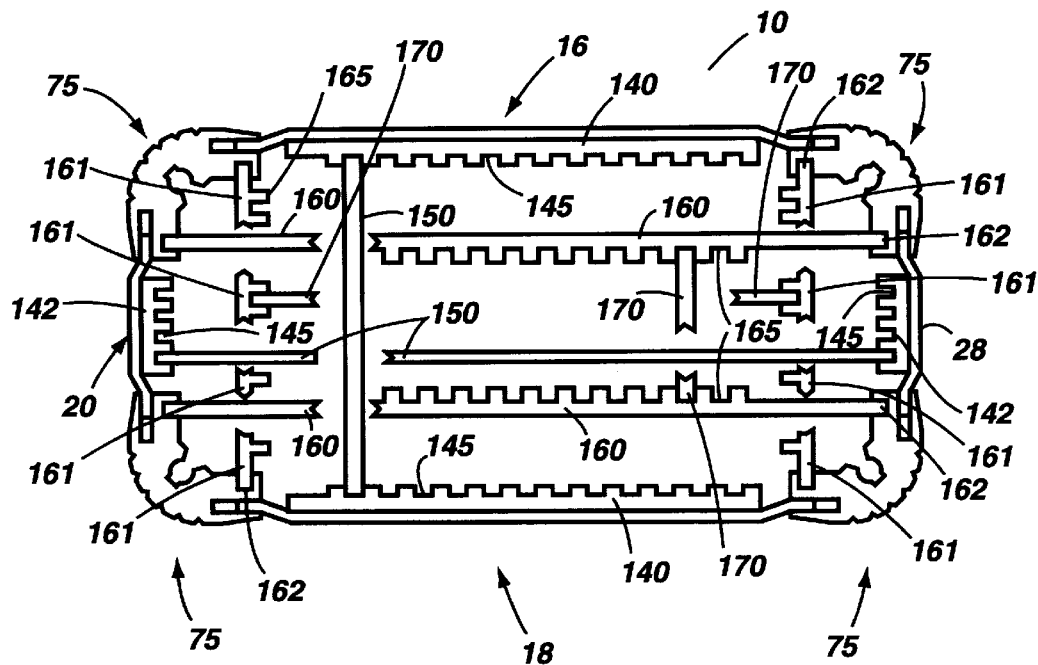
FIG. 7 is a side elevational view similar to FIG. 6, but showing a formed card guide tray secured within the interior of the present invention.

The first alternative utilizes a pair of card guide trays 140 or 142, one each of which is adhesively secured to the interior surface of two opposite side panels as shown in FIG. 7. The channels 145 formed in each such tray cooperate with the other tray on the opposite side panel to provide for the securing within the cabinet of a plurality of circuit boards 150.

The second alternative utilizes a pair of straight card guide trays 160 or 161 as is also shown in FIG. 7. Each tray 160 includes an insert portion 162 which is held in the second pair of grooves of adjacent frame members, so that when assembled the pair of trays 160 are generally parallel to one another. Channels 165 formed in each such tray cooperate with the other tray on the opposite side panel to provide for the securing within the cabinet of a plurality of circuit boards 170.

Figure 8:
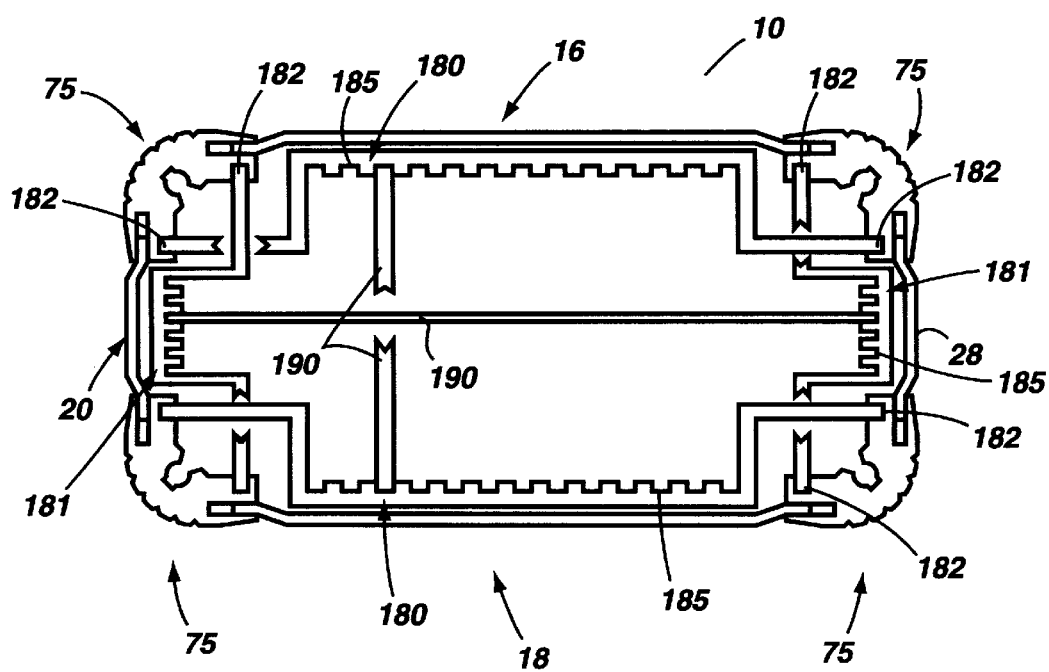
FIG. 8 is a side elevational view similar to FIG. 6, but showing a formed card guide tray secured within the interior of the present invention.

The third alternative utilizes a pair of formed card guide trays 180 or 181 as shown in FIG. 8. The tray includes an insert portion 182 which is held in the second pair of grooves of adjacent frame members. The tray also features side walls 183 which extend between the each tray's insert portion 182 and the channel containing portion 184 with channels 185, so that when assembled the pair of trays are generally parallel to one another. Channels 185 formed in each such tray cooperate with the other tray on the opposite side panel to provide for the securing within the cabinet of a plurality of circuit boards 190.

As such, the invention provides a cabinet for holding one or more circuit boards, which cabinet can have its dimensions modified in order to accommodate various sized circuit boards. Due to space considerations only a couple of circuit boards are shown in each of FIGS. 6–8, however, it should be understood that a plurality of boards can be held by each pair of opposed trays.

The cabinet can easily be fabricated using either plastic or metal for the side panels and panel members. Thus it can be appreciated that the components can be extruded, and configured such that they can be used more than once in the cabinet to be fabricated.

It should also be understood that the first and second panel members may have cut-out portions therein for displaying or accessing additional electronic equipment, as well as for the providing of electrical cord access. Additionally, at least one of the panel members may include an outwardly extending L-flange, which L-flange has apertures therein for the insertion therethrough of screws or other appropriate fasteners, in order to make the cabinet fixed in position.

While the form of apparatus herein described constitutes a preferred embodiment of this invention, it is to be understood that the invention is not limited to this precise form of apparatus and that changes may be made therein without departing from the scope of the invention which is defined in the appended claims.

What is claimed is:

1. A circuit board storage cabinet assembly comprising first and second panel members, a plurality of elongate frame members connected to said panel members, each of said frame members having a first pair of grooves disposed perpendicularly to each other and a second pair of grooves disposed perpendicularly to each other, and a plurality of side panels, each of said side panels having two edges, each of said side panels having two side edges, a central planar portion having a planar outer surface and a planar inner surface, a panel insert portion directly adjacent each of said side edges, and a pair of intermediate panel portions, each of said intermediate panel portions extending between said central planar portion and one of said panel insert portions, each elongate frame member first pair of grooves having disposed therein adjacent side panels, said second pair of grooves of adjacent frame members cooperate to hold a circuit board.

2. The circuit board storage cabinet according to claim 1 wherein each panel member is directly adjacent an elongate frame member.

3. The circuit board storage cabinet according to claim 1 wherein each side panel is directly adjacent a panel member.

4. The circuit board storage cabinet according to claim 1 wherein each frame member utilizes only one of its two second grooves to cooperate with one of the two second grooves on an adjacent frame members to hold a circuit board.

5. A circuit board storage cabinet assembly comprising first and second panel members, a plurality of elongate frame members connected to said panel members, each of said frame members having a first pair of grooves disposed perpendicularly to each other and a second pair of grooves disposed perpendicularly to each other, each one of said first pair of grooves is directly adjacent to one of the second pair of grooves, with each one of said first pair of grooves is perpendicular to the one of said second pair of grooves which is directly adjacent to it, each frame member utilizing only one of its two second grooves to cooperate with one of the two second grooves on an adjacent frame member to hold a circuit board, and a plurality of side panels, each of said side panels having two edges, each elongate frame member first pair of grooves having disposed therein adjacent side panels.

6. The circuit board storage cabinet according to claim 5 wherein each panel member is directly adjacent an elongate frame member.

7. The circuit board storage cabinet according to claim 5 wherein each side panel is directly adjacent a panel member.

8. The circuit board storage cabinet according to claim 5 wherein each side panel has two side edges, a central planar portion having a planar outer surface and a planar inner surface, a panel insert portion directly adjacent each of said side edges, and a pair of intermediate panel portions, each of said intermediate panel portions extending between said central planar portion and one of said panel insert portions.

9. A circuit board storage cabinet assembly comprising first and second panel members, a plurality of elongate frame members connected to said panel members, each of said frame members having a first pair of grooves disposed perpendicularly to each other and a second pair of grooves disposed perpendicularly to each other, said second pair of grooves of adjacent frame members cooperating to hold a circuit board, and a plurality of side panels, each of said side panels having two edges, each elongate frame member first pair of grooves having disposed therein adjacent side panels, each side panel comprising an insert panel portion and a central planar portion, each said insert panel portion being in a plane parallel to the said central planar portion of the respective side panel.

10. The circuit board storage cabinet according to claim 9 wherein each panel member is directly adjacent an elongate frame member.

11. The circuit board storage cabinet according to claim 9 wherein each side panel is directly adjacent a panel member.

12. The circuit board storage cabinet according to claim 9 wherein each side panel has two side edges, a central planar portion having a planar outer surface and a planar inner surface, a panel insert portion directly adjacent each of said side edges, and a pair of intermediate panel portions, each of said intermediate panel portions extending between said central planar portion and one of said panel insert portions.

13. The circuit board storage cabinet according to claim 9 wherein each frame member utilizes only one of its two second grooves to cooperate with one of the two second grooves on an adjacent frame members to hold a circuit board.

14. The circuit board storage cabinet according to claim 9 wherein each one of said first pair of grooves is directly adjacent to one of the second pair of grooves, with each one of said first pair of grooves being perpendicular to the one of said second pair of grooves which is directly adjacent to it.

* * * * *